(12) United States Patent
Tsai et al.

(10) Patent No.: US 6,921,924 B2
(45) Date of Patent: Jul. 26, 2005

(54) SEMICONDUCTOR LIGHT-EMITTING DEVICE

(75) Inventors: Tzong-Liang Tsai, Hsinchu (TW); Chih-Sung Chang, Hsinchu (TW); Tzer-Perng Chen, Hsinchu (TW)

(73) Assignee: United Epitaxy Company, LTD, Hsinchu (TW)

(*) Notice: Subject to any disclaimer, the term of this patent is extended or adjusted under 35 U.S.C. 154(b) by 0 days.

(21) Appl. No.: 10/463,393

(22) Filed: Jun. 18, 2003

(65) Prior Publication Data
US 2004/0256627 A1 Dec. 23, 2004

(51) Int. Cl.$^7$ ............................................. H01L 33/00
(52) U.S. Cl. ............................ 257/95; 257/81; 257/88; 257/98; 257/99; 257/103
(58) Field of Search ............................ 257/81, 88, 95, 257/98, 99, 103

(56) References Cited

U.S. PATENT DOCUMENTS

| | | | |
|---|---|---|---|
| 5,727,008 A | * 3/1998 | Koga | 372/43 |
| 6,576,533 B2 | * 6/2003 | Tomiya et al. | 438/481 |
| 2002/0088970 A1 | * 7/2002 | Yu et al. | 257/12 |
| 2002/0145148 A1 | * 10/2002 | Okuyama et al. | 257/88 |
| 2003/0047745 A1 | * 3/2003 | Suzuki et al. | 257/103 |

* cited by examiner

Primary Examiner—Minhloan Tran
Assistant Examiner—Tan Tran
(74) Attorney, Agent, or Firm—Winston Hsu

(57) ABSTRACT

A method for manufacturing a semiconductor light-emitting device. The semiconductor light-emitting device has a substrate, and a semiconductor layer, a n-type semiconductor layer, and a p-type semiconductor layer successively formed atop the substrate. The method forms an intermediate layer having a predetermined pattern between the substrate and the semiconductor layer, or between the semiconductor layer and the n-type semiconductor layer, or between the n-type semiconductor layer and the p-type semiconductor layer. The p-type semiconductor layer has an uneven top layer due to the intermediate layer having a predetermined pattern and the total internal reflection of the LED can be reduced. The intermediate layer is a conductive material to reduce serial resistance of the LED.

6 Claims, 9 Drawing Sheets

SEMICONDUCTOR LIGHT-EMITTING DEVICE

BACKGROUND OF THE INVENTION

1. Field of the Invention

The present invention relates to a method for manufacturing semiconductor light-emitting device, especially to a method for manufacturing semiconductor light-emitting device with high efficiency.

2. Description of the Related Art

Semiconductor light-emitting devices such as light-emitting diodes (LEDs) have high light emission, fast response speed and longer life than other conventional light source. Therefore, the LEDs are promising in lighting application, especially after the successful development of the high-brightness blue LED.

To enhance light-emitting efficiency, the LED can adopt a hetero-junction structure to improve the internal quantum efficiency thereof. However, the light emitted from an active layer of the LED is subjected to total internal reflection (TIR) between the active layer and an upper cladding layer, and between the upper cladding layer and an air interface due to refractive index mismatch. In particular, when the light passes from a medium with a higher refractive index to another medium with a lower refractive index as the light is emitted out, the TIR problem is inevitable, thus degrading the external quantum efficiency of the LED.

FIG. 1 illustrates a schematic, cross-sectional view of a homo-junction GaN-based LED 3. The LED 3 comprises a sapphire substrate 300, a buffer layer 302 on the sapphire substrate 300, an n-type GaN layer 304 and a p-type GaN layer 306, all successively formed on the buffer layer 302. The LED 3 further comprises p-electrode 310 and n-electrode 308 for applying electric power thereto. After applying electric power to the LED 3, light is emitted from an active layer (not label, shown as shaded layer). Part of the light (such as ray R2) suffers TIR in the interface between the p-type GaN layer 306 and air and is reflected into the LED 3, thus degrading the external quantum efficiency of the LED. This problem is irrelevant to the structure of active layer. Therefore, an LED with a hetero-junction structure, single quantum well (SQW) structure or multiple quantum well (MQW) structure also suffers this problem.

SUMMARY OF THE INVENTION

It is the object of the present invention to provide a method for manufacturing a semiconductor light-emitting device having high efficiency.

To achieve the above objects, the present invention provides a method for manufacturing a semiconductor light-emitting device, which includes the steps of:
  providing a substrate;
  providing a semiconductor layer atop the substrate;
  providing an intermediate layer with predetermined pattern atop the semiconductor layer;
  providing a first-conductive type semiconductor layer atop the intermediate layer, wherein the thickness of the first-conductive type semiconductor layer atop the intermediate layer and the thickness of the first-conductive type semiconductor layer not atop the intermediate layer are different;
  providing a second-conductive type semiconductor layer, the second-conductive type semiconductor layer having uneven top face due to the intermediate layer, thus reducing total internal reflection of the semiconductor light-emitting device.

To achieve the above objects, the present invention provides a method for manufacturing semiconductor light-emitting device, which includes the steps of:
  providing a substrate;
  providing a semiconductor layer atop the substrate;
  providing a first-conductive type semiconductor layer atop the semiconductor layer;
  providing an intermediate layer with predetermined pattern atop the first-conductive type semiconductor layer;
  providing a second-conductive type semiconductor layer atop the intermediate layer, wherein the thickness of the second-conductive type semiconductor layer atop the intermediate layer and the thickness of the first-conductive type semiconductor layer not atop the intermediate layer are different, the second-conductive type semiconductor layer having uneven top face due to the intermediate layer, thus reducing total internal reflection of the semiconductor light-emitting device.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENT

Figure 1:
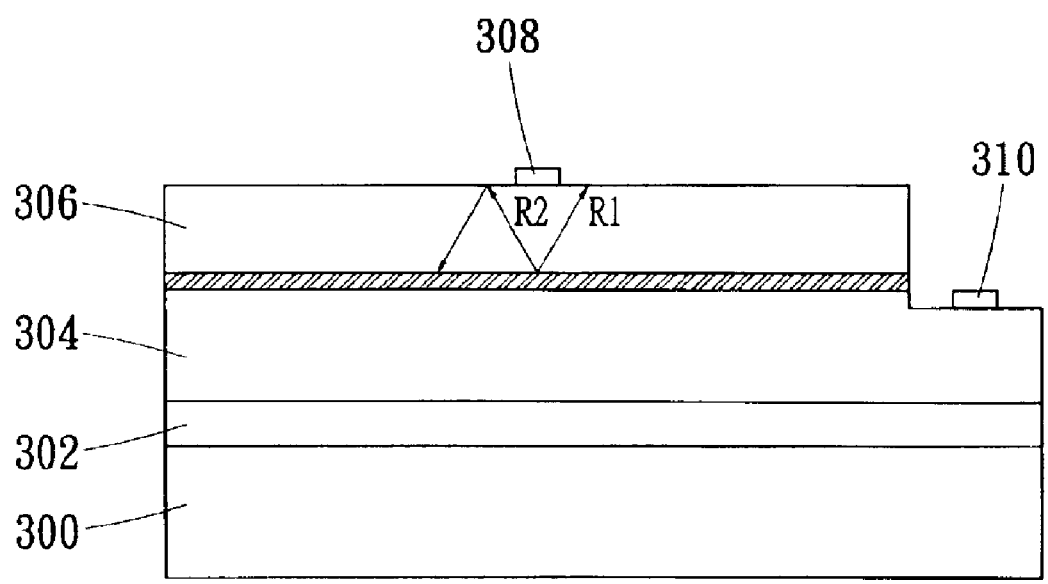
FIG. 1 illustrates a schematic, cross-sectional view of a prior art GaN-based LED.
Figure 2A:
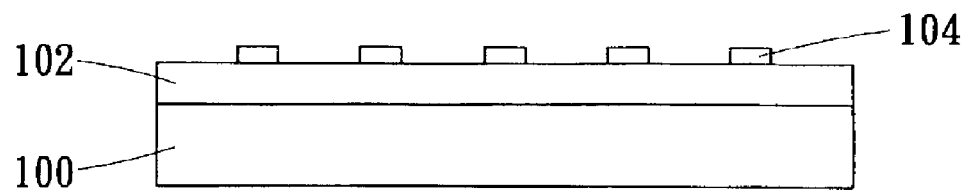
FIGS. 2A–2C are schematic, cross-sectional views illustrating the steps of the method for manufacturing semiconductor light-emitting device according to a first preferred embodiment of the present invention.
Figure 2B:
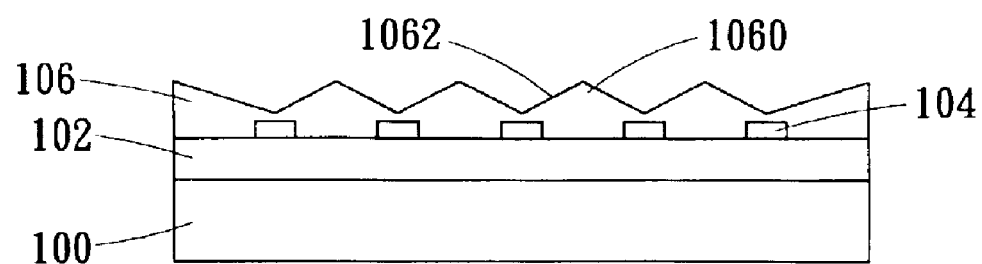
Figure 2C:
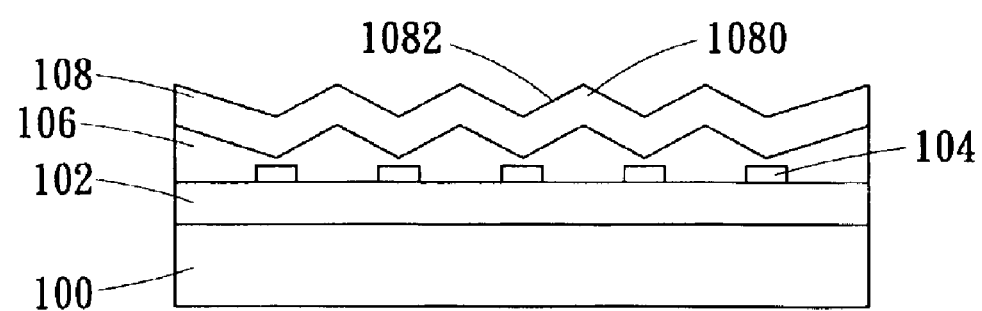

FIGS. 2A–2C are schematic, cross-sectional sectional views illustrating the steps of the method for manufacturing semiconductor light-emitting device according to a first preferred embodiment of the present invention. The first preferred embodiment of the present invention is exemplified with homo-junction LED. However, the method according to the present invention can also be applied to an LED with a hetero-junction structure, single quantum well (SQW) structure, or multiple quantum well (MQW) structure.

Figure 3A:
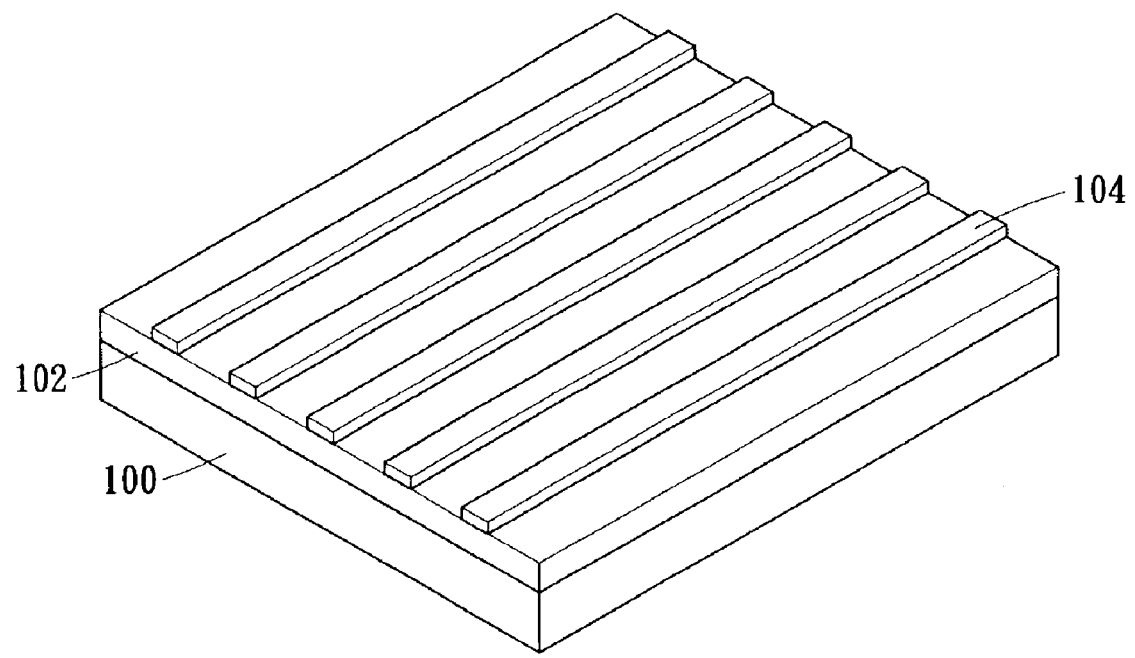
FIGS. 3A–3D depict the preferred examples of the intermediate layer.
Figure 3B:
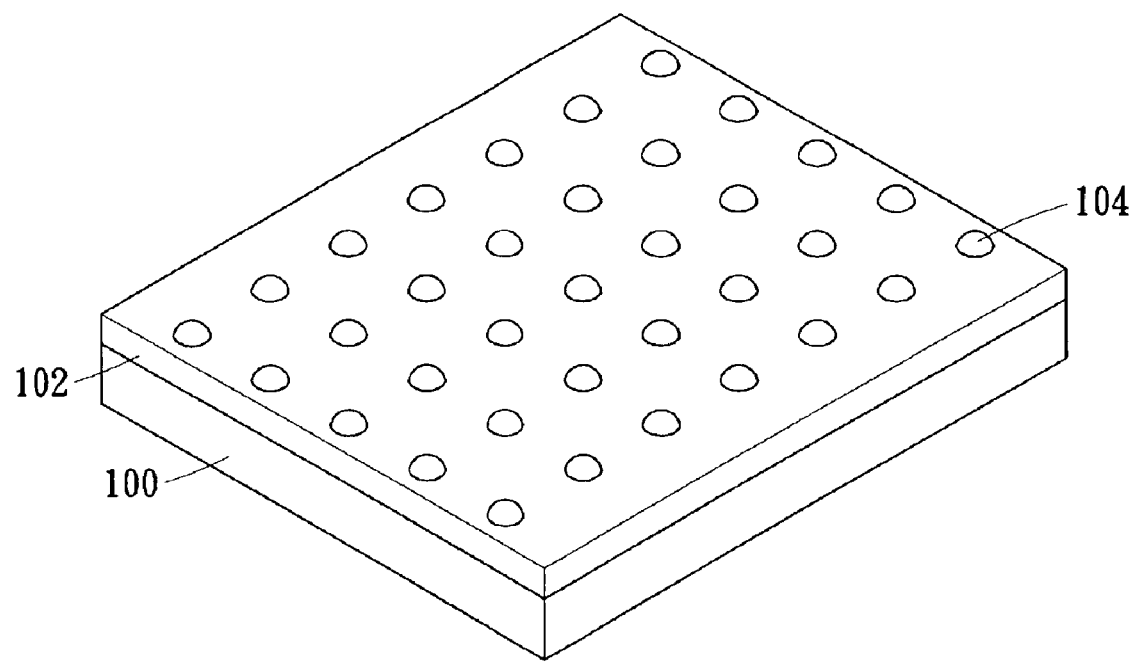
Figure 3C:
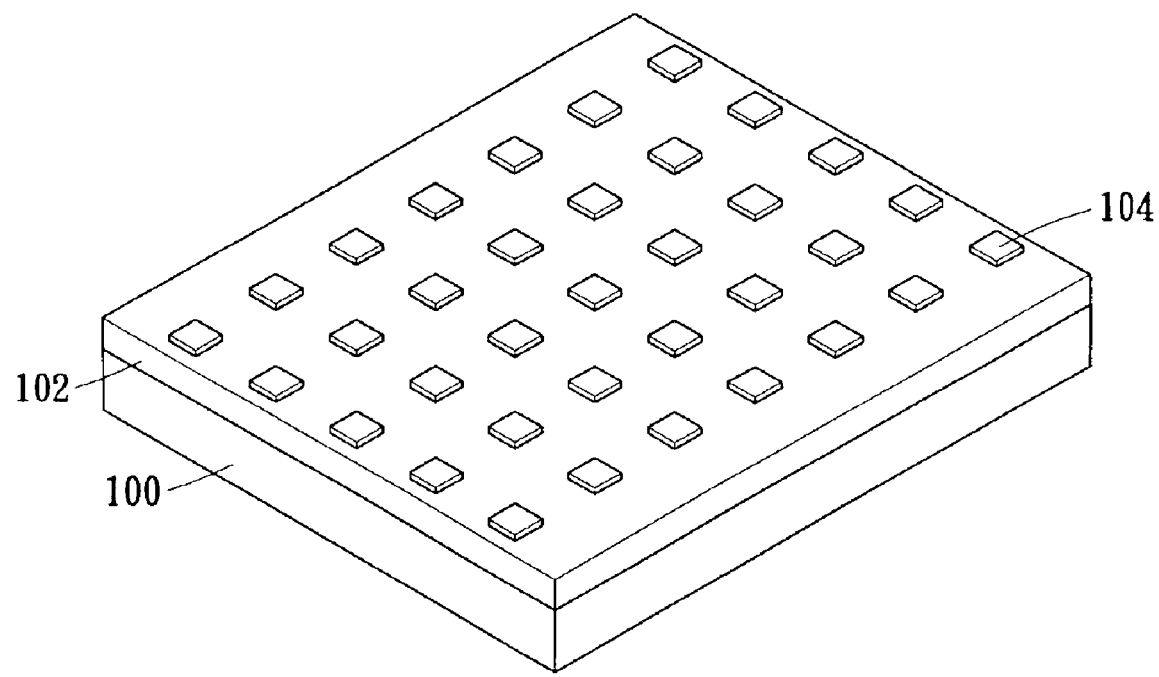
Figure 3D:
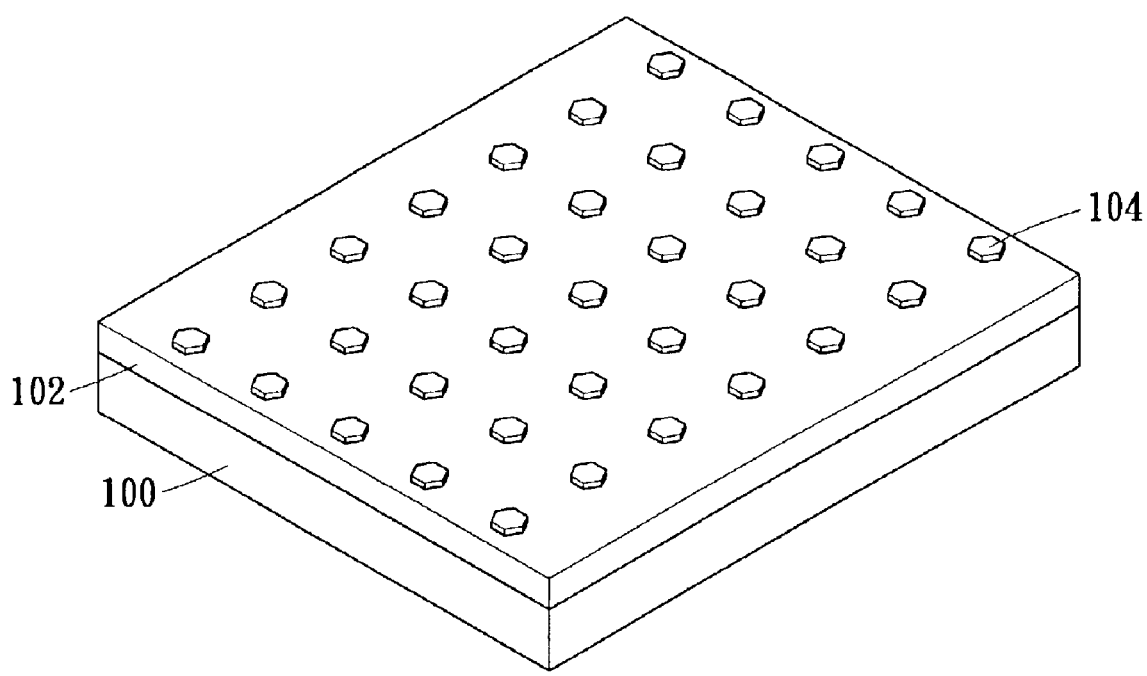

As shown in FIG. 2A, after preparing a substrate 100 such as, for example, a sapphire substrate, a semiconductor layer 102 such as, for example, a GaN buffer layer is formed along a principle axis such as, for example, the C-axis of the substrate 100. An intermediate layer 104 with predetermined pattern is formed atop the semiconductor layer 102 by deposition or other conventional film-forming process. The predetermined pattern of the intermediate layer 104 can be a striped pattern as shown in FIG. 3A, a dotted pattern as shown in FIG. 3B, a rectangular pattern as shown in FIG. 3C or a hexagonal pattern as shown in FIG. 3D. In the preferred embodiment shown in FIG. 2A, the intermediate layer 104 has a striped pattern. The intermediate layer 104 can be an insulating material such as $SiO_2$, $Si_3N_4$, or a conductive material such as metal or conductive oxide such as ITO. The intermediate layer 104 can be patterned by a suitable mask layer and photolithography process after a layer of insulating material or conductive material is formed. The pattern defining and etching skill is well known in related art and is not stated in detail here.

Figure 4A:
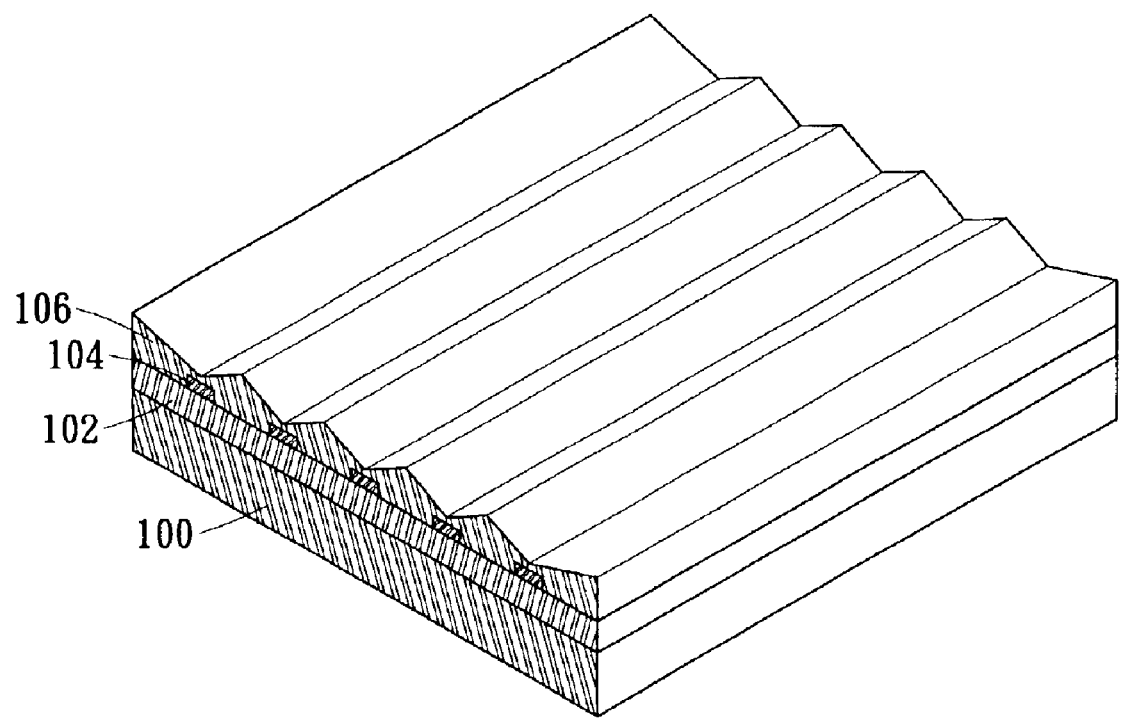
FIGS. 4A–4B depict the effect of the intermediate layer for layers thereon.
Figure 4B:
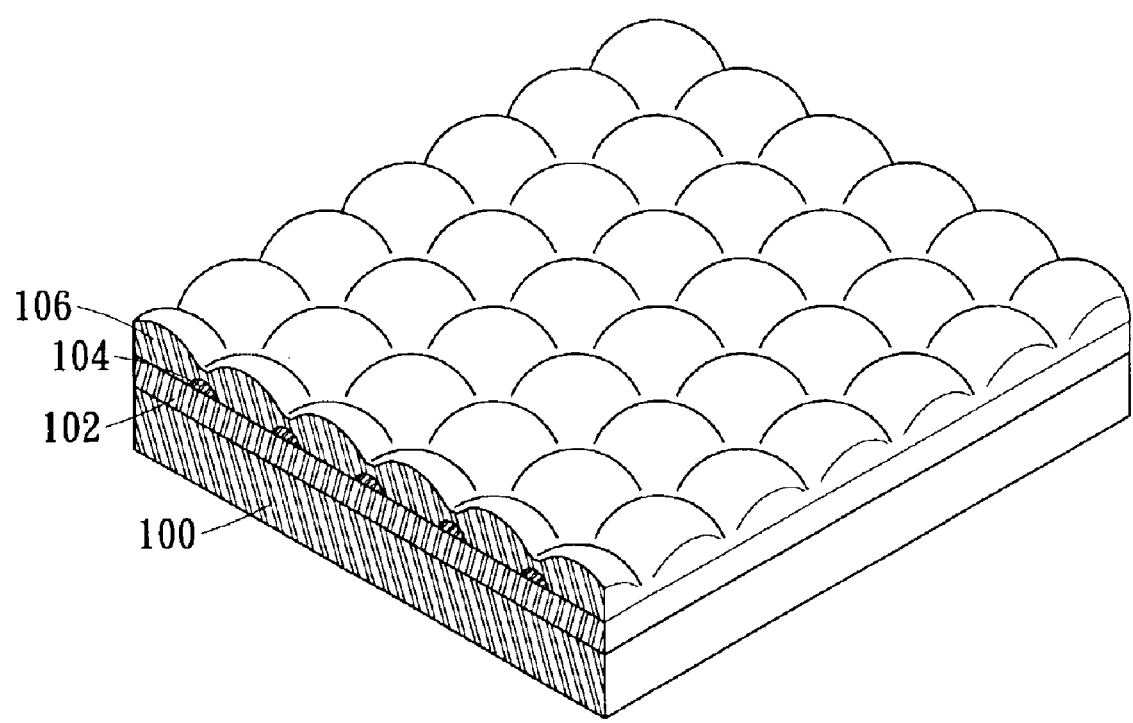

As shown in FIG. 2B, an n-type semiconductor layer 106 is formed atop the intermediate layer 104 by epitaxial technology such as MOCVD or VPE. The n-type semiconductor layer 106 can be, for example, a GaN layer doped with Si. The patterned intermediate layer 104 provides an uneven top surface on the semiconductor layer 102. The n-type semiconductor layer 106 is grown not only along the principle C-axis of the substrate 100 but also along other axes of GaN crystal such as an S-axis, and the growth rates along different direction are different for the n-type semiconductor layer 106. The n-type semiconductor layer 106 has a higher growth rate on the surface of the semiconductor layer 102 exposed by the patterned intermediate layer 104. Therefore, the n-type semiconductor layer 106 has a ridged cross section as shown in FIG. 4A. The top face of the n-type semiconductor layer 106 has a plurality of ridges 1060, each of the ridges 1060 has two inclined faces 1062. FIG. 4B shows the perspective view of the n-type semiconductor layer 106 when the intermediate layer 104 has dot shaped pattern. As shown in this figure, the n-type semiconductor layer 106 has sphere-like projections 1064 on top face thereof. In a word, the n-type semiconductor layer 106 has an uneven top face due to the roughness provided by the patterned intermediate layer 104.

As shown in FIG. 2C, a p-type semiconductor layer 108 is formed atop the n-type semiconductor layer 106. The p-type semiconductor layer 108 can be, for example, a GaN layer doped with Mg. The p-type semiconductor layer 108 is formed atop the uneven n-type semiconductor layer 106 and still has uneven top face 1080 with inclined faces 1082. Finally, a p-electrode (not shown) and an n-electrode (not shown) are formed on resulting structure to complete the LED.

Figure 5:
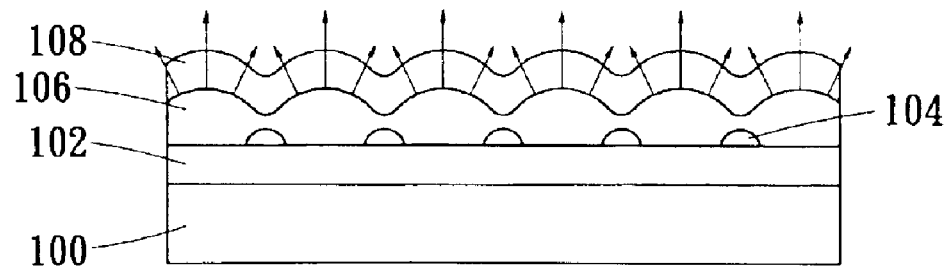
FIG. 5 depicts the effect of the intermediate layer for improving TIR.

As shown in FIG. 5, if the p-type semiconductor layer 108 has uneven top face such as a spherical top face, most light emitted from the p/n junction of the LED has incident angles less than the critical angle for LED-air interface. The external quantum efficiency of the LED can be enhanced. The efficiency and life of the LED can be further enhanced if the intermediate layer 104 adopts a conductive material to reduce series resistance of the LED.

Figure 6A:
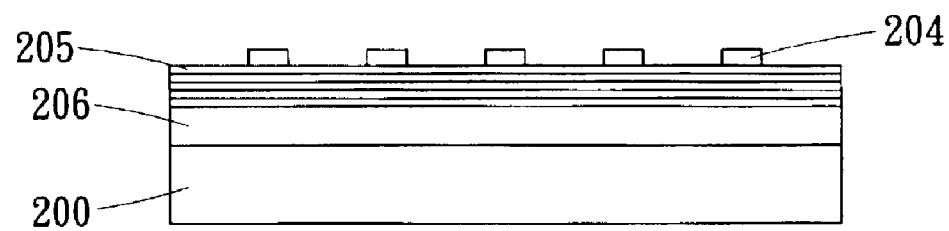
FIGS. 6A–6B are schematic, cross-sectional sectional views illustrating the steps of the method for manufacturing semiconductor light-emitting device according to a second preferred embodiment of the present invention.
Figure 6B:
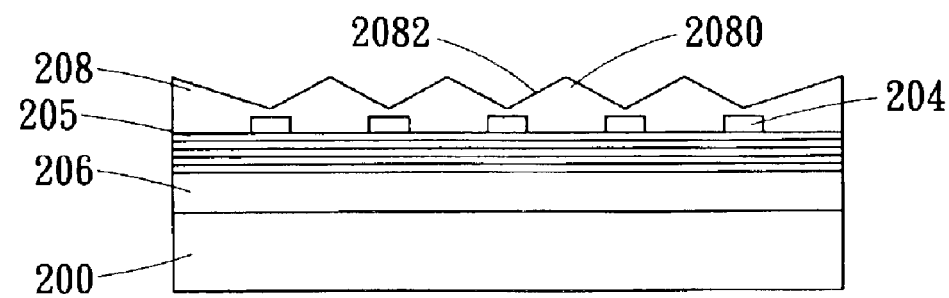

FIGS. 6A–6B are schematic, cross-sectional views showing the steps of the method for manufacturing a semiconductor light-emitting device according to a second preferred embodiment of the present invention. The second preferred embodiment of the present invention is exemplified with an MQW LED. However, the method according to the present invention can also be applied to an LED with a heterojunction structure or a single quantum well (SQW) structure.

As shown in FIG. 6A, after preparing a substrate 200 (such as a sapphire substrate), a semiconductor layer 202 such as a GaN buffer layer is formed along a principle axis such as a C-axis of the substrate 200. An n-type semiconductor layer 206 is formed atop the semiconductor layer 202 by epitaxial technology such as MOCVD or VPE. The n-type semiconductor layer 206 can be, for example, a GaN layer doped with Si. A MQW layer 205, such as an InGaN MQW layer, is formed atop the n-type semiconductor layer 206. An intermediate layer 204 with predetermined pattern is formed atop the MQW layer 205 by deposition or another conventional film-forming process. The predetermined pattern of the intermediate layer 204 can be striped, dotted, rectangular, or hexagonal in shape. In the example shown in FIG. 6A, the predetermined pattern of the intermediate layer 204 is a striped pattern. The intermediate layer 204 can adopt insulating material such as $SiO_2$, $Si_3N_4$, or conductive material such as metal or conductive oxide such as ITO. The intermediate layer 204 can be patterned by a suitable mask layer and photolithography process after a layer of insulating material or conductive material is formed. The pattern defining and etching skill is well known in related art and is not stated in detail here.

As shown in FIG. 6B, a p-type semiconductor layer 208 is formed atop the patterned intermediate layer 204. The p-type semiconductor layer 208 can be, for example, a GaN layer doped with Mg. The p-type semiconductor layer 208 is formed atop the uneven intermediate layer 204. The p-type semiconductor layer 208 is grown not only along the principle C-axis of the substrate 200 but also along another axis of GaN crystal such as the S-axis, and the growth rates in different directions are different for the p-type semiconductor layer 208. The p-type semiconductor layer 208 has a higher growth rate on the surface of the MQW layer 205 uncovered by the patterned intermediate layer 204. Therefore, the p-type semiconductor layer 208 has a ridge shaped cross-section as shown in FIG. 6B. The top face of the p-type semiconductor layer 208 has a plurality of ridges 2080 and each of the ridges 2080 has two inclined faces 2082. Finally, a p-electrode (not shown) and an n-electrode (not shown) are formed on resulting structure to complete the LED.

Similarly, if the p-type semiconductor layer 208 has an uneven top face such as a spherical top face, most light emitted from MQW layer 205 of the LED has incident angles less than the critical angle for LED-air interface. The external quantum efficiency of the LED can be enhanced. The efficiency and life of the LED can be further enhanced if the intermediate layer 204 adopts a conductive material to reduce series resistance of the LED.

Although the present invention has been described with reference to the preferred embodiment thereof, it will be understood that the invention is not limited to the details thereof. Various substitutions and modifications have suggested in the foregoing description, and others will occur to those of ordinary skill in the art. For example, the intermediate layer can also be provided between the substrate and the semiconductor layer and can be adopted other material. The substrate can be other substrate such as GaAs. The semiconductor layer is a GaN layer or an AlN layer. Therefore, all such substitutions and modifications are intended to be embraced within the scope of the invention as defined in the appended claims.

What is claimed is:

1. A semiconductor light emitting device, comprising a substrate, and a semiconductor layer, a first-conductive type semiconductor layer, and a second-conductive type semiconductor layer successively formed atop the substrate; and an intermediate layer having a predetermined pattern and formed below the second-conductive type semiconductor layer such that the second-conductive type semiconductor layer has an uneven top face, and wherein the intermediate layer is an insulating material.

2. The semiconductor light-emitting device as in claim 1, wherein the first-conductive type is n-type and the second-conductive type is p-type.

3. The semiconductor light-emitting device as in claim 1, wherein the first-conductive type is p-type and the second-conductive type is n-type.

4. The semiconductor light-emitting device as in claim 1, wherein the substrate is sapphire, the semiconductor layer is a GaN layer or an AlN layer, and the first-conductive type semiconductor layer and the second-conductive type semiconductor layer are a GaN-based material.

5. The semiconductor light-emitting device as in claim 1, wherein the predetermined pattern of the intermediate layer is striped, dotted, rectangular shape or hexagonal in shape.

6. A semiconductor light-emitting device comprising a substrate and a semiconductor layer, a first-conductive type semiconductor layer and a second-conductive type semiconductor layer successively formed atop the substrate, and an intermediate layer having a predetermined pattern and formed below the second-conductive type semiconductor layer such that the second-conductive type semiconductor layer has an uneven top face, and wherein the intermediate layer is metal or a conductive oxide.

* * * * *